United States Patent
Azuma et al.

(10) Patent No.: US 9,263,853 B2
(45) Date of Patent: Feb. 16, 2016

(54) OPTICAL SEMICONDUCTOR DEVICE, METHOD FOR MANUFACTURING OPTICAL SEMICONDUCTOR DEVICE, AND METHOD FOR MANUFACTURING OPTICAL MODULE

(71) Applicant: Mitsubishi Electric Corporation, Tokyo (JP)

(72) Inventors: Yusuke Azuma, Tokyo (JP); Eitaro Ishimura, Tokyo (JP); Kimitaka Shibata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 102 days.

(21) Appl. No.: 14/300,269

(22) Filed: Jun. 10, 2014

(65) Prior Publication Data

US 2015/0101161 A1    Apr. 16, 2015

(30) Foreign Application Priority Data

Oct. 16, 2013   (JP) .................................. 2013-215482

(51) Int. Cl.
*H01S 5/16* (2006.01)
*G01B 11/02* (2006.01)
*G01B 11/14* (2006.01)
*H01S 5/02* (2006.01)

(52) U.S. Cl.
CPC ................ *H01S 5/16* (2013.01); *G01B 11/028* (2013.01); *G01B 11/14* (2013.01); *H01S 5/0202* (2013.01); *Y10T 29/41* (2015.01)

(58) Field of Classification Search
USPC .......................................................... 33/1 D
See application file for complete search history.

(56) References Cited

U.S. PATENT DOCUMENTS

| | | | | |
|---|---|---|---|---|
| 4,547,446 A * | 10/1985 | Tam | .......................... | G03F 9/70 356/399 |
| 4,600,309 A * | 7/1986 | Fay | ....................... | G03F 9/7049 356/400 |
| 4,606,643 A * | 8/1986 | Tam | ....................... | G03F 9/7076 356/401 |
| 4,623,257 A * | 11/1986 | Feather | ............... | G03F 7/70633 356/400 |
| 4,647,850 A * | 3/1987 | Henderson | ............. | G01B 7/003 148/DIG. 102 |
| 4,742,233 A * | 5/1988 | Kuyel | ................... | H01L 21/681 250/491.1 |
| 5,017,514 A * | 5/1991 | Nishimoto | .......... | G03F 7/70591 356/400 |
| 5,111,476 A * | 5/1992 | Hollenbeck | .......... | G02B 6/4226 372/107 |
| 5,156,982 A * | 10/1992 | Nagoya | ............... | G03F 7/70633 356/400 |
| 5,262,258 A * | 11/1993 | Yanagisawa | ........ | G03F 7/70633 430/22 |
| 5,296,917 A * | 3/1994 | Kusonose | ........... | G03F 7/70633 250/492.2 |
| 5,506,684 A * | 4/1996 | Ota | ........................ | G01B 11/26 250/548 |
| 5,771,218 A * | 6/1998 | Feldman | ................ | G11B 7/123 257/98 |

(Continued)

FOREIGN PATENT DOCUMENTS

JP         56033828 A  *  4/1981
JP      2000-216489 A      8/2000

*Primary Examiner* — Ari M Diacou
(74) *Attorney, Agent, or Firm* — Leydig, Voit & Mayer, Ltd.

(57) ABSTRACT

An optical semiconductor device includes: a resonator end face; an optical waveguide; a window structure located between the resonator end face and the optical waveguide; and a vernier on the window structure and allowing measurement of length of the window structure along an optical axis direction.

8 Claims, 6 Drawing Sheets

(56) References Cited

U.S. PATENT DOCUMENTS

| | | | | |
|---|---|---|---|---|
| 5,886,971 A * | 3/1999 | Feldman | G11B 7/123 | 257/98 |
| 5,936,738 A * | 8/1999 | Liebmann | G01B 11/026 | 356/401 |
| 6,083,843 A * | 7/2000 | Ohja | G02B 6/30 | 216/24 |
| 6,141,360 A * | 10/2000 | Kinugawa | H01S 3/0826 | 372/102 |
| 6,463,577 B1 * | 10/2002 | Omata | G03F 1/78 | 378/35 |
| 6,465,322 B2 * | 10/2002 | Ziger | G03F 7/70633 | 148/DIG. 102 |
| 6,486,954 B1 * | 11/2002 | Mieher | G01B 11/002 | 356/399 |
| 6,636,312 B1 * | 10/2003 | Hsin | G03F 7/70633 | 356/401 |
| 6,963,061 B2 * | 11/2005 | Richard | G02B 6/43 | 250/227.14 |
| 7,312,880 B2 * | 12/2007 | Whitefield | G01N 21/9503 | 356/625 |
| 7,582,899 B2 * | 9/2009 | Koh | G03F 7/70633 | 257/48 |
| 2003/0175531 A1 * | 9/2003 | Fournel | C30B 33/00 | 428/441 |
| 2003/0180637 A1 * | 9/2003 | Ulrich | G03F 7/70633 | 430/22 |
| 2004/0119956 A1 * | 6/2004 | Fukagawa | G03F 7/70616 | 355/52 |
| 2005/0012928 A1 * | 1/2005 | Sezginer | G01B 11/26 | 356/401 |
| 2006/0044571 A1 * | 3/2006 | Whitefield | G01N 21/9503 | 356/625 |
| 2007/0076205 A1 * | 4/2007 | Schulz | G03F 7/70633 | 356/401 |
| 2007/0170603 A1 * | 7/2007 | Takahashi | G02B 6/4224 | 257/797 |

* cited by examiner

OPTICAL SEMICONDUCTOR DEVICE, METHOD FOR MANUFACTURING OPTICAL SEMICONDUCTOR DEVICE, AND METHOD FOR MANUFACTURING OPTICAL MODULE

BACKGROUND OF THE INVENTION

1. Field of the Invention

The present invention relates to an optical semiconductor device, a method for manufacturing an optical semiconductor device, and a method for manufacturing an optical module which can thereby easily measure the length of the window structure.

2. Background Art

In optical semiconductor devices with a window structure formed on a resonator end face, a length of the window structure varies depending on a position of cleavage for forming the resonator end face (e.g., see Japanese Patent Laid-Open No. 2000-216489).

SUMMARY OF THE INVENTION

Since the length of the window structure has an influence on characteristics of the optical semiconductor device, it is desirable to determine the quality of the optical semiconductor device according to the length of the window structure. However, with conventional structures, it has been not possible to easily measure the length of the window structure.

Moreover, the length of the window structure also has an influence on efficiency of coupling with optical parts. However, with the conventional structures, since it is not possible to easily measure the length of the window structure, mounting positions of the optical semiconductor device and optical parts are determined independently of the length of the window structure. Therefore, there has been a problem that the coupling efficiency varies.

In view of the above-described problems, an object of the present invention is to provide an optical semiconductor device, a method for manufacturing an optical semiconductor device, and a method for manufacturing an optical module which can thereby easily measure the length of the window structure.

According to the present invention, an optical semiconductor device includes: a resonator end face; an optical waveguide; a window structure formed between the resonator end face and the optical waveguide; and a vernier on the window structure and allowing a length of the window structure along an optical axis direction to be measured.

The present invention provides a vernier capable of measuring the length of the window structure on the window structure, and can thereby easily measure the length of the window structure.

Other and further objects, features and advantages of the invention will appear more fully from the following description.

DETAILED DESCRIPTION OF THE PREFERRED EMBODIMENTS

An optical semiconductor device, a method for manufacturing an optical semiconductor device, and a method for manufacturing an optical module according to the embodiments of the present invention will be described with reference to the drawings. The same components will be denoted by the same symbols, and the repeated description thereof may be omitted.

First Embodiment

Figure 1:
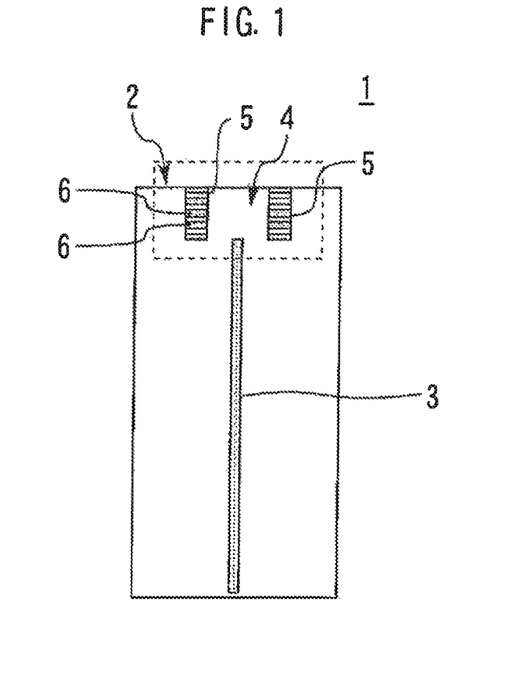
FIG. 1 is a top view illustrating an optical semiconductor device according to a first embodiment of the present invention.
Figure 2:
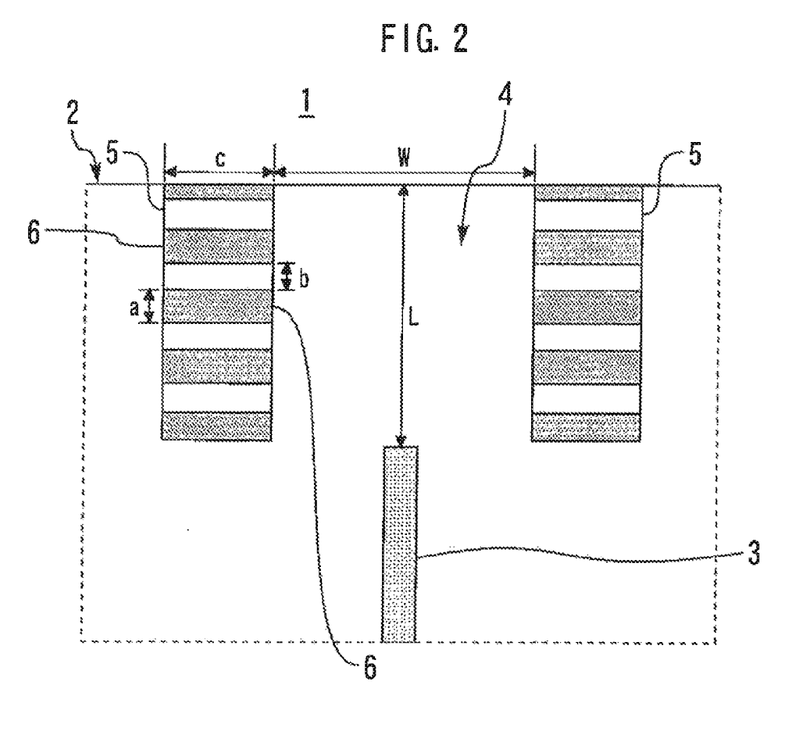
FIG. 2 is an enlarged top view of main parts in FIG. 1.

FIG. 1 is a top view illustrating an optical semiconductor device according to a first embodiment of the present invention. FIG. 2 is an enlarged top view of main parts in FIG. 1. In the optical semiconductor device 1, a window structure 4 is formed between a resonator end face 2 and an optical waveguide 3. A vernier 5 is provided on the window structure 4. This vernier 5 provides scales that are spaced at regular intervals and allow the length of the window structure 4 along an optical axis direction (resonator direction) to be measured. The length L of the window structure 4 is the length along the optical axis direction from the resonator end face 2 to an end of the optical waveguide 3.

In the present embodiment, the vernier 5 is a pattern of groove 6 dug in the semiconductor of the window structure 4 by dry etching. Note that wet etching may also be used instead of dry etching The pattern of groove 6 is arranged periodically in the optical axis direction. The verniers 5 are spaced at the same distance from the center of the chip width on the left and right in a direction perpendicular to the optical axis.

In FIG. 2, the following definitions are adopted: the length of the pattern of groove 6 in the optical axis direction is a, the interval between grooves in the optical axis direction is b, the width of the groove in the direction perpendicular to the optical axis direction is c, and the interval between grooves in the direction perpendicular to the optical axis direction is W.

Figure 3:
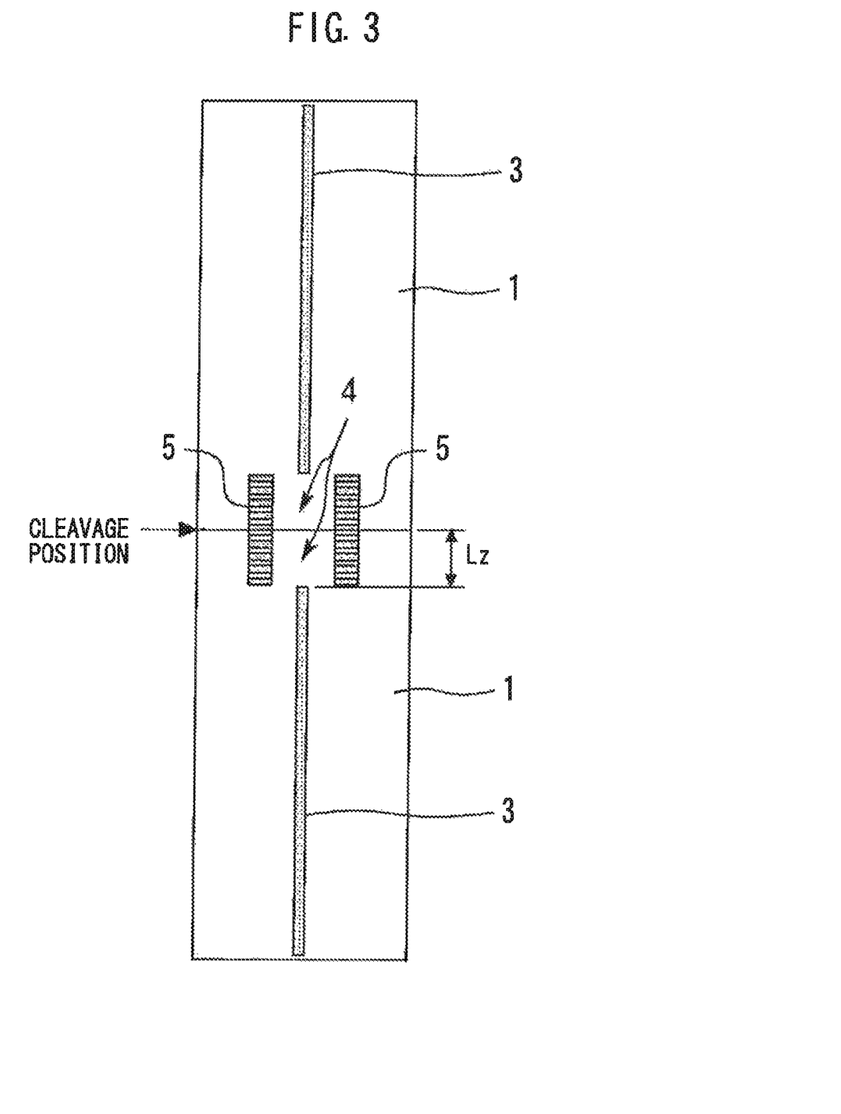
FIG. 3 is a top view illustrating manufacturing steps of the optical semiconductor device according to the first embodiment of the present invention.

Next, a method of manufacturing the above-described optical semiconductor device will be described. FIG. 3 is a top view illustrating manufacturing steps of the optical semiconductor device according to the first embodiment of the present invention. First, the two optical semiconductor devices 1 are formed on a wafer with the window structures 4 placed facing each other. The two optical semiconductor devices 1 are then separated apart through cleavage. The length of the window structure 4 varies depending on the cleavage position.

The sum of the lengths of the window structures 4 of the two optical semiconductor devices 1 facing each other is defined as 2×Lz. The length of the window structure 4 when cleavage takes place right in the middle of the two optical semiconductor devices 1 facing each other is Lz.

The lengths a, b and Lz are determined so as to satisfy:

$$Lz=(a+b)\times n+a/2 (n \text{ is an integer})$$

and the optical semiconductor device is manufactured. For example, suppose Lz=21 µm, a=2 µm, b=2 µm, c=10 µm, W=70 µm, and n=5.

When the number of grooves 6 is m (m is an integer), the length of the window structure 4 is between (a+b)×(m−1) and (a+b)×m. For example, when a=2 µm, b=2 µm and m=8, the length L of the window structure 4 is 28 µm to 32 µm.

Although the length L of the window structure 4 varies depending on the cleavage position, it is possible to easily measure the length L of the window structure 4 by observing the vernier 5 from the top surface and counting the number of grooves 6 in the optical axis direction. The quality of the optical semiconductor device 1 is determined according to the length. That is, a device is determined as a conforming item when the length L of the window structure 4 falls within a certain range or as a non-conforming item when the length L of the window structure 4 falls outside the range. This allows electrical and optical characteristic tests to be omitted and allows the manufacturing cost to be reduced.

Figure 4:
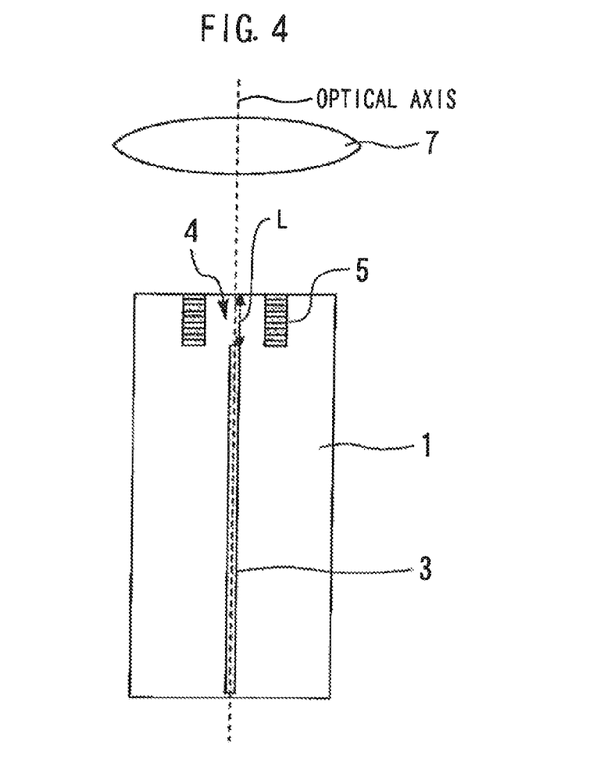
FIG. 4 is a top view illustrating manufacturing steps of the optical module according to the first embodiment of the present invention.

Next, a method of manufacturing an optical module using the above-described optical semiconductor device will be described. FIG. 4 is a top view illustrating manufacturing steps of the optical module according to the first embodiment of the present invention. First, the length L of the window structure 4 of the optical semiconductor device 1 is measured using the above-described method. Next, the mounting position of the optical semiconductor device 1 in the optical axis direction with respect to a lens 7 (optical part) is adjusted according to the length. This allows the efficiency of coupling between the lens 7 and the optical semiconductor device 1 to be adjusted.

When the number of grooves 6 of the optical semiconductor device is m (m is an integer), if the distance between the lens 7 and the optical semiconductor device 1 is adjusted by [Lz−{(a+b)×m+a}], it is possible to prevent deterioration of the coupling efficiency due to a length variation of the window structure 4.

Note that the shape of the groove 6 is not limited to a rectangle, but it may also be a rhombus, triangle, circle or the like. The vernier 5 is not limited to a pattern of groove 6, but it may also be an insulating film pattern of SiN, SiO$_2$ or the like or a metal pattern of Au or the like. The verniers 5 are arranged at the same interval from the center of the optical waveguide 3 on the left and right, but the vernier may be arranged only one side.

Second Embodiment

Figure 5:
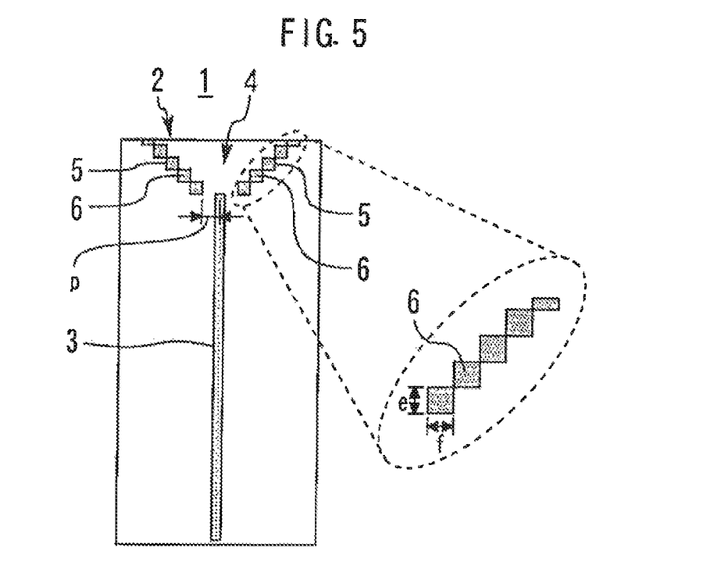
FIG. 5 is a top view illustrating an optical semiconductor device according to a second embodiment of the present invention.
Figure 6:
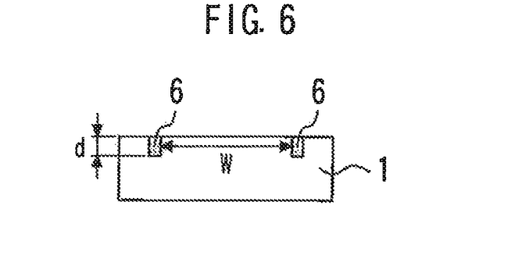
FIG. 6 is a side view of the optical semiconductor device in FIG. 5 viewed from the resonator end face side.

FIG. 5 is a top view illustrating an optical semiconductor device according to a second embodiment of the present invention. FIG. 6 is a side view of the optical semiconductor device in FIG. 5 viewed from the resonator end face side. The vernier 5 is a stepped pattern. This facilitates pattern recognition of the vernier 5. The interval between the two grooves 6 of the vernier 5 varies according to a distance from the resonator end face 2.

The length of the groove 6 in the optical axis direction is defined as e and the width in a direction perpendicular to the optical axis is defined as f. The lengths e and Lz are determined so as to satisfy Lz=e×n+e/2 (n is an integer) and the optical semiconductor device 1 is formed.

Figure 7:
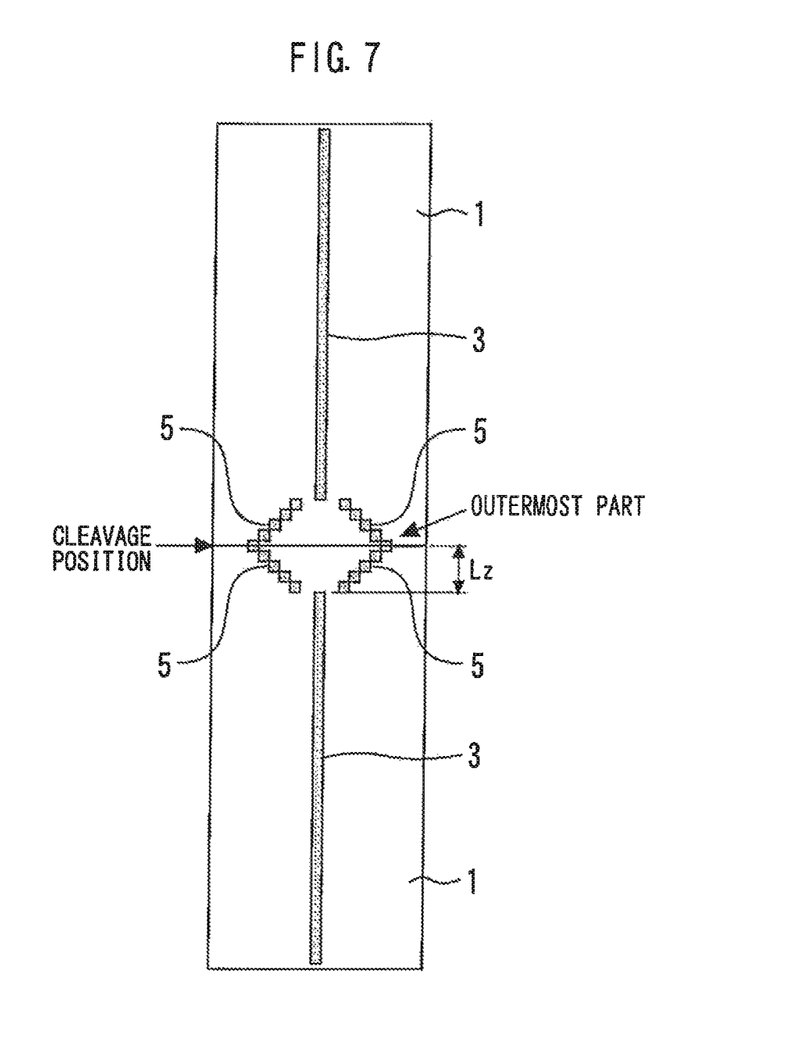
FIG. 7 is a top view illustrating manufacturing steps of the optical semiconductor device according to the second embodiment of the present invention.

Next, a method of manufacturing the above-described optical semiconductor device will be described. FIG. 7 is a top view illustrating manufacturing steps of the optical semiconductor device according to the second embodiment of the present invention. First, the two optical semiconductor devices 1 are formed on a wafer with the window structures 4 placed facing each other. Next, the two optical semiconductor devices 1 are separated apart through cleavage.

Although the length L of the window structure 4 varies depending on the cleavage position, it is possible to easily measure the length L of the window structure 4 by observing the vernier 5 from the top surface and counting the number of grooves 6 in the optical axis direction. The quality of the optical semiconductor device 1 is determined according to the length.

When the number of grooves 6 is m (m is an integer), the length L of the window structure 4 is between e×(m−1) and e×m. For example, when Lz=21 µm, e=2 µm, n=10, and m=8, the length L of the window structure 4 is 14 µm to 16 µm.

Moreover, as shown in FIG. 6, it is also possible to observe the device from the resonator end face 2 side, measure the interval between the two grooves 6 and determine the length of the window structure 4, and thereby determine the quality of the optical semiconductor device 1 according to the length. However, the method of measuring the length of the window structure 4 varies depending on whether or not cleavage takes place at a position including the outermost part of the vernier 5. First, the vernier 5 is observed from the top surface and it is observed whether or not cleavage takes place at the position including the outermost part of the vernier 5.

When the outermost part of the vernier 5 is not included, the length L of the window structure L is between (W/2−p)/f×e and (W/2−p)/f×e+e. Here, the distance from the center of the chip width to the groove is assumed to be p. For example, when Lz=21 µm, e=2 µm, f=2 µm, p=10 µm, and W=60 µm, the length L of the window structure 4 is 20 µm to 22 µm.

When the outermost part of the vernier 5 is included, the length L of the window structure 4 is between [Lz+(W/2−p)/f×e] and [Lz+(W/2−p)/f×e+e]. For example, when Lz=21 µm, e=2 µm, f=2 µm, p=10 µm, and W=40 µm, the length L of the window structure 4 is 31 µm to 33 µm.

Even in the case where the vernier 5 is observed from the top surface and the number of grooves 6 can only be counted with rough accuracy, the length L of the window structure 4 can be measured by measuring the interval of the grooves 6 from the resonator end face 2 side.

Third Embodiment

Figure 8:
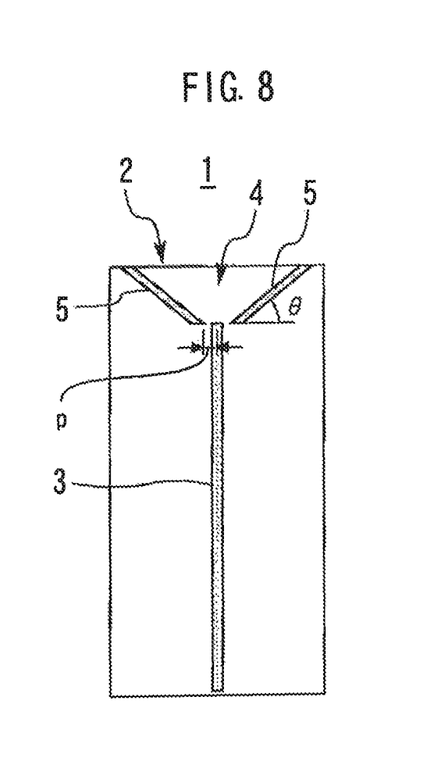
FIG. 8 is a top view illustrating an optical semiconductor device according to a third embodiment of the present invention.

FIG. 8 is a top view illustrating an optical semiconductor device according to a third embodiment of the present invention. The vernier 5 is a pattern of two linear grooves 6, a mutual interval of which varies depending on the distance from the resonator end face 2. In this case, it is also possible to achieve effects similar to those in the second embodiment and it is easier to form a pattern than in the second embodiment. The angle of the groove is assumed to be θ.

Figure 9:
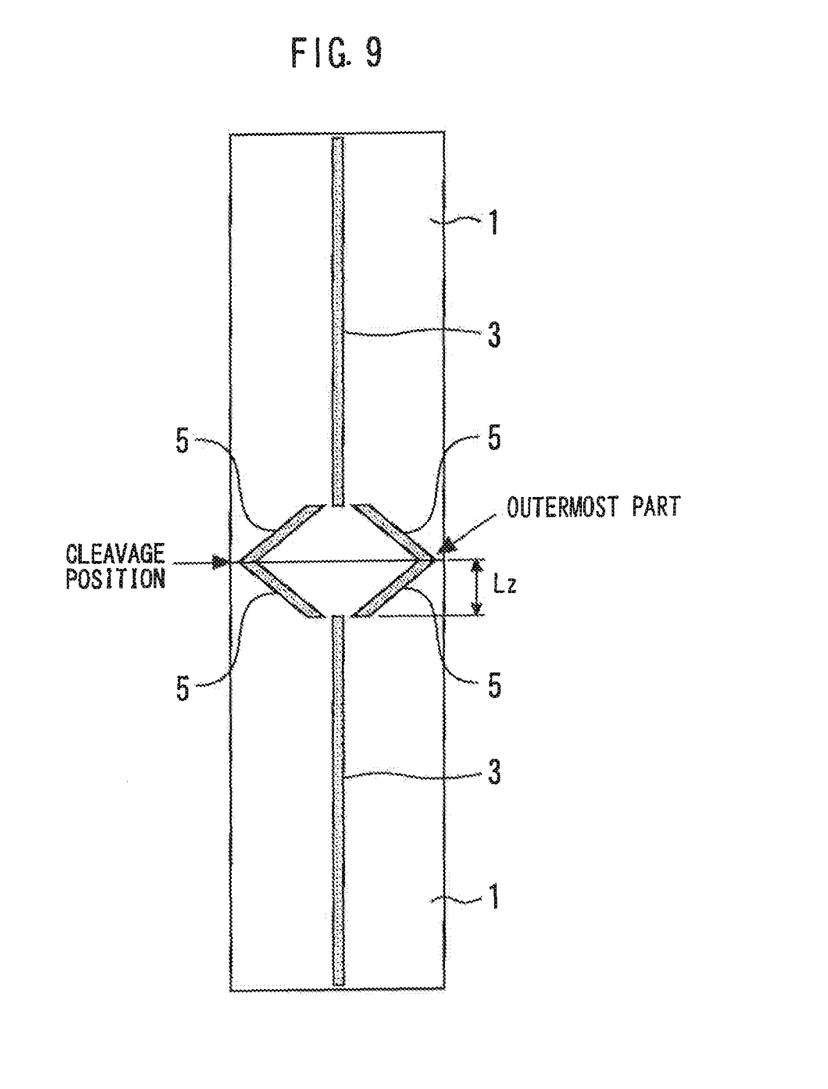
FIG. 9 is a top view illustrating manufacturing steps of the optical semiconductor device according to the third embodiment of the present invention.

Next, a method of manufacturing the above-described optical semiconductor device will be described. FIG. 9 is a top view illustrating manufacturing steps of the optical semiconductor device according to the third embodiment of the present invention. First, the two optical semiconductor devices 1 are formed on a wafer with the window structures 4 placed facing each other. The two optical semiconductor devices 1 are then separated apart through cleavage.

The length of the window structure 4 varies depending on the cleavage position. As in the case of the second embodiment, the interval between the two groove patterns is measured by observing the device from the resonator end face 2 side, the length of the window structure 4 is determined and the quality of the optical semiconductor device 1 is determined according to the length. However, the method of measuring the length of the window structure 4 varies depending on whether or not cleavage takes place at a position including the outermost part of the vernier 5.

First, the vernier 5 is observed from the top surface and it is observed whether or not cleavage takes place at the position including the outermost part of the vernier 5. When the outermost part of the vernier 5 is not included, the length L of the window structure 4 is (W/2−p)×tan 74 . When the outermost part of the vernier 5 is included, the length L of the window structure 4 is L=2×Lz−(W/2−p)×tan θ. Thus, by measuring the interval of grooves 6 from the resonator end face 2 side, it is possible to measure the length L of the window structure 4.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-215482, filed on Oct. 16, 2013 including specification, claims, drawings and summary, on which the Convention priority of the present application is based, is incorporated herein by reference in its entirety.

What is claimed is:

1. An optical semiconductor device comprising:
   a resonator end face;
   an optical waveguide;
   a window structure located between the resonator end face and the optical waveguide; and
   a vernier on the window structure and allowing measurement of length of the window structure along an optical axis direction.

2. The optical semiconductor device according to claim 1, wherein the vernier is a pattern of grooves in a semiconductor layer of the window structure.

3. The optical semiconductor device according to claim 2, wherein the vernier is a pattern of two linear grooves separated by an interval which varies with distance from the resonator end face.

4. The optical semiconductor device according to claim 1, wherein the vernier is an insulating film pattern or a metal pattern.

5. The optical semiconductor device according to claim 1, wherein the vernier is a stepped pattern.

6. A method for testing an optical semiconductor device which includes a resonator end face, an optical waveguide, a window structure located between the resonator end face and the optical waveguide, and a vernier on the window structure and allowing measurement of length of the window structure along an optical axis direction, the method comprising:
   observing the vernier and measuring the length of the window structure; and
   determining quality of the optical semiconductor device according to the length of the window structure that is measured.

7. The method for testing the optical semiconductor device according to claim 6, wherein
   the vernier is a pattern of grooves in a semiconductor layer of the window structure,
   the vernier is a pattern of two linear grooves, separated by an interval which varies with distance from the resonator end face, and
   the method comprises:
      observing the vernier from the resonator end face, measuring the separation between the two grooves, and determining the length of the window structure; and
      determining quality of the optical semiconductor device according to the length of the window structure that is measured.

8. A method for manufacturing an optical module including an optical semiconductor device having a resonator end face, an optical waveguide, a window structured located between the resonator end face and the optical waveguide, and a vernier on the window structure and allowing measurement of length of the window structure along an optical axis direction, the method comprising:
   measuring the length of the window structure; and
   adjusting mounting position of the optical semiconductor device in the optical axis direction with respect to an optical part according to the length of the window structure that is measured.

* * * * *